(12) United States Patent
Moser

(10) Patent No.: US 8,831,138 B2
(45) Date of Patent: Sep. 9, 2014

(54) CIRCUIT FOR TRANSMITTING ASK RF SIGNALS WITH DATA SIGNAL EDGE ADAPTATION

(71) Applicant: EM Microelectronic-Marin SA, Marin (CH)

(72) Inventor: Michel Moser, Cheyres (CH)

(73) Assignee: EM Microelectronic-Marin SA, Marin (CH)

( * ) Notice: Subject to any disclaimer, the term of this patent is extended or adjusted under 35 U.S.C. 154(b) by 0 days.

(21) Appl. No.: 13/720,216

(22) Filed: Dec. 19, 2012

(65) Prior Publication Data

US 2013/0163697 A1   Jun. 27, 2013

(30) Foreign Application Priority Data

Dec. 21, 2011 (EP) .................................. 11194995

(51) Int. Cl.
| | |
|---|---|
| H04L 27/04 | (2006.01) |
| H03F 1/02 | (2006.01) |
| H03F 3/72 | (2006.01) |
| H03F 1/22 | (2006.01) |
| H03F 3/21 | (2006.01) |
| H03F 1/32 | (2006.01) |
| H03F 3/24 | (2006.01) |

(52) U.S. Cl.
CPC .......... *H04L 27/04* (2013.01); *H03F 2200/331* (2013.01); *H03F 1/0277* (2013.01); *H03F 2203/7236* (2013.01); *H03F 3/72* (2013.01); *H03F 1/223* (2013.01); *H03F 3/211* (2013.01); *H03F 1/3241* (2013.01); *H03F 3/245* (2013.01)
USPC ........... 375/300; 375/295; 375/296; 375/267; 375/352; 330/135; 330/136; 330/251; 330/278; 455/114.2; 455/114.3; 455/115.3; 455/127.1

(58) Field of Classification Search
USPC .......... 375/300, 295, 296, 297, 352; 330/135, 330/136, 251, 278; 455/114.2, 114.3, 455/115.3, 127.1
See application file for complete search history.

(56) References Cited

U.S. PATENT DOCUMENTS

| | | | | |
|---|---|---|---|---|
| 5,923,223 | A | * | 7/1999 | Termerinac et al. .......... 332/103 |
| 6,181,199 | B1 | * | 1/2001 | Camp et al. ..................... 330/10 |

(Continued)

OTHER PUBLICATIONS

Li, Chien-Jung et al., "High Average-Efficiency Multimode RF Transmitter Using a Hybrid Quadrature Polar Modulator", IEEE Transactions on Circuits and Systems II: Expressbriefs, IEEE, US, Mar. 2008, pp. 249-253, Express Briefs vol. 55, No. 3.

(Continued)

*Primary Examiner* — Siu Lee
(74) *Attorney, Agent, or Firm* — Sughrue Mion, PLLC

(57) ABSTRACT

The circuit is provided for the transmission of data amplitude modulated radio frequency signals. The circuit includes a local oscillator for generating an oscillating signal at a determined carrier frequency, a unit for shaping data pulses to supply a data amplitude modulation control signal (Vmod), and a power amplifier receiving the oscillating signal and the data amplitude modulation control signal (Vmod) for the transmission of data amplitude modulated radio frequency signals by an antenna or an antenna arrangement. The data pulse shaping unit (13) includes a pulse shaper (21) for digitally adapting the data transition edges on the basis of an incoming digital data signal (d), and a digital-analog conversion stage (26, 27) for converting a digital data signal shaped in the unit, in order to supply the data amplitude modulation control signal (Vmod) to the power amplifier.

15 Claims, 5 Drawing Sheets

(56) References Cited

U.S. PATENT DOCUMENTS

| | | | | |
|---|---|---|---|---|
| 6,421,379 | B1* | 7/2002 | Vannatta et al. | 375/229 |
| 6,912,372 | B2* | 6/2005 | McCorkle et al. | 455/39 |
| 7,394,881 | B2* | 7/2008 | Jensen | 375/350 |
| 7,560,989 | B2 | 7/2009 | Buescher et al. | |
| 2007/0190952 | A1 | 8/2007 | Waheed et al. | |
| 2008/0045163 | A1* | 2/2008 | Strandberg et al. | 455/91 |
| 2009/0004981 | A1 | 1/2009 | Eliezer et al. | |
| 2010/0188148 | A1 | 7/2010 | Mehta et al. | |

OTHER PUBLICATIONS

Geiser, Bernd et al. "Bandwidth Extension for Hierarchical Speech and Audio Coding in ITU-T Rec. G.729.1", IEEE Transactions on Audio, Speech, and Language Processing, IEEE Service Center, Nov. 2007, pp. 2496-2509, vol. 15, No. 8.

* cited by examiner

A

B

CIRCUIT FOR TRANSMITTING ASK RF SIGNALS WITH DATA SIGNAL EDGE ADAPTATION

This application claims priority from European Patent Application No. 11194995.4 filed Dec. 21, 2011, the entire disclosure of which is incorporated herein by reference.

FIELD OF THE INVENTION

The present invention concerns an electronic circuit for transmitting amplitude modulated radio frequency signals, which is fitted with a means of shaping the edges of the data signals to be transmitted. The electronic circuit output includes a power amplifier connected to an antenna for transmitting ASK RF signals in a wireless communication system.

BACKGROUND OF THE INVENTION

Within industrial, scientific and medical applications (ISM), wireless communication systems typically use signals at the carrier frequency, which is comprised within frequency ranges reserved for such applications. The carrier frequency of these signals is generally around 434 MHz or 868 MHz.

The spectral bandwidth of transmitted ASK (Amplitude Shift Keying) RF signals must, in principle, be limited to avoid interfering with the transmission of a nearby transmitter in a close frequency band and to facilitate reception of the signals by a nearby receiver. Consequently, it may be envisaged to reduce the output power, particularly in the output power amplifier of the transmitter circuit. It is also possible to envisage reducing the data transmission rate, encoding the baseband data or adapting certain modulation techniques. Controlling the transitions between two data symbols may also be envisaged.

Where a C-class output power amplifier is used for a high efficiency transmitter circuit, it is often difficult firstly to directly limit the bandwidth of the signals to be transmitted, and secondly to decrease the output power in an easy manner. A high efficiency transmitter circuit with a C-class power amplifier is not generally linear. A capacitor may, for example, be mounted between the gate and drain terminals of a MOS transistor of the power amplifier. However, this type of arrangement reduces the efficiency of the transmitter circuit. Moreover, this arrangement is generally impractical for these power amplifiers for transmitting radio frequency signals.

U.S. Pat. No. 7,560,989 may be cited, which discloses an output power amplifier circuit for the transmission of ASK RF signals as shown in FIG. 1. This transmitter circuit therefore includes an output power amplifier unit 1, which is configured to control the desired output power. The power amplifier unit 1 can be connected to an antenna assembly 4, which is shown in FIG. 1 in dashed lines from the output terminal $PA\_{OUT}$ of power amplifier unit 1. Power amplifier unit 1 includes several parallel amplifier cells A, B, C, D, which are generally connected between an earth terminal and output terminal $PA\_{OUT}$. In this example, said amplifier cells are amplifier cells in a cascode arrangement, which are each formed of two series connected NMOS transistors N1 and N2. A determined variable current $I_A, I_B, I_C, I_D$ can pass through each operating cell.

A power controller 2 of the transmitter circuit selects a combination of amplifier cells to be activated to set up a desired output power for transmitting ASK data signals. The selection of amplifier cells to be activated thus provides rudimentary amplitude or transmitted power control. To be able to activate this type of amplifier cell of the power amplifier unit, the gate of a second transistor N2 is controlled by a control voltage at a level close to the positive terminal of a supply voltage source. Each combination of activated amplifier cells defines a predetermined power or respectively amplitude level of the output signal from the power amplifier unit.

Said power amplifier transmitter circuit further includes (not shown in FIG. 1), a reference cell, which is a replica cell similar to one of amplifier cells A, B, C, D, a current generator and a voltage generator. The current generator and the voltage generator are connected to the power controller 2. The current generator supplies a reference current, and the voltage generator supplies a reference voltage. The reference current is mirrored in the replica cell, which is formed of two MOS transistors in a cascode arrangement. The current mirrored in the replica cell controls the current in each activated cell of power amplifier unit 1.

A voltage regulator of the power amplifier circuit can also set a regulator voltage $V_{REG}$ for powering an inverter, the output of which is directly connected to the gate terminal of each first transistor N1 of each cell, A, B, C, D of power amplifier unit 1. This inverter 3 receives at input a signal RF_in at a desired carrier frequency for the data signals to be transmitted. By switching on and interrupting the voltage regulator, which powers inverter 3, it is possible to obtain ON-OFF keying.

An adaptation, for modifying the power or shape of the data signals, can therefore be carried out by selecting amplifier cells A, B, C, D or also by adapting the reference current mirrored in the replica cell. However, this requires a considerable number of electronic components to achieve this adaptation, which constitutes a drawback. Moreover, there is nothing provided to reduce sufficiently the bandwidth of the ASK RF signals to be transmitted, which constitutes another drawback.

As previously mentioned, the use of amplitude shift keying (ASK) is generally at a larger bandwidth and it is often necessary to reduce said bandwidth. For this purpose, the data transition edges may be attenuated to a greater or lesser extent to reduce the effective bandwidth of the transmitted signal. To achieve this, it may be envisaged to add a third transistor in series with the other two transistors in each amplifier cell of the power amplifier unit of the transmitter circuit. This third transistor of each amplifier cell may be controlled across its gate by an ASK modulating signal to modulate the amplitude of the carrier frequency RF signals to be transmitted. The edges of each transition in the data to be transmitted are smoothed or attenuated by gradually varying the gate voltage of the third transistor. The gate voltage varies progressively on the basis of a variation in the control current in a current control loop which includes a current ramp generator. This means that the rapidity of state transition in the data to be transmitted is attenuated by the ASK RF signals.

This arrangement also requires several low-pass filters, capable of being configured by a binary word, between a replica cell of the current control loop and each amplifier cell, in order to properly adapt the shape of the ASK RF signal envelope to be transmitted. For any current ramp or envelope modification of the ASK RF signals to be transmitted, the transfer function of each low-pass filter must also be modified in the analogue domain at the power amplifier input. This filter is achieved in the usual way by an array comprising capacitors and resistors and/or one or more operational amplifiers. The filter acts on a baseband signal, which involves relatively low cutoff frequencies. These cutoff frequencies can typically be configured between several kilohertz and several hundred kilohertz. The capacitance and resistance values required are therefore relatively high, which leads to a large integration surface area. This constitutes a drawback. Adapting the data transition edges in the analogue domain also depends on the manufacturing method used. The resistance and capacitance values of the filter, and the properties of the transistors, particularly in the power amplifier, vary according to the manufacturing method. This constitutes another drawback. Moreover, several current sources of different values must be generated in the analogue domain, which constitutes another drawback.

SUMMARY OF THE INVENTION

It is therefore an object of the invention to overcome the drawbacks of the state of the art by providing a digital amplitude modulation transmitter circuit for radio frequency signals, which includes a means of attenuating the transition edges of the ASK RF data signals that can easily digitally be set and is thus capable of occupying a reduced integrated circuit surface area.

The invention therefore concerns a data amplitude modulation circuit for the transmission of radio frequency signals, the circuit including:

a local oscillator for generating an oscillating signal at a determined carrier frequency, a unit for shaping data pulses to supply a data amplitude modulation control signal, and a power amplifier receiving the oscillating signal from the local oscillator and the data amplitude modulation control signal from the data pulse shaping unit, for the transmission of data amplitude modulated radio frequency signals by an antenna or an antenna arrangement, wherein the data pulse shaping unit includes a pulse shaper for digitally adapting the data transition edges on the basis of an incoming digital data signal, and a digital-analogue conversion stage for converting a digital data signal shaped in the unit, so as to supply the data amplitude modulation control signal to the power amplifier.

Specific embodiments of the circuit for transmitting ASK RF signals are defined in the dependent claims 2 to 12.

One advantage of the digital amplitude modulation transmitter circuit for RF signals lies in the fact that digital means are used to shape the data pulses and to attenuate data transition edges for the transmission of ASK data signals. This type of digital pulse shaper circuit can be implemented in several embodiments. The common feature of these embodiments is that the transition shape between two data symbols is defined by one or more wave shapes stored in the form of one or more digital value sample sequences in a memory of the circuit. By reprogramming this memory, it is easy, depending upon the use application of the transmitter circuit, to adapt the shape of the transitions between the data. The pulse shaper can for example include a raised cosine filter, which can be implemented in form of an FIR (finite impulse response) type filter.

One advantage of the data amplitude modulation transmitter circuit for RF signals lies in the fact that the power amplifier can be formed simply by two series connected MOS transistors in a cascode arrangement. One of the transistors is controlled across its gate by an oscillating signal at the carrier frequency supplied by a local oscillator, whereas the other transistor is controlled across its gate by the modulation voltage supplied by a unit for shaping the modulating ASK signal. The modulating signal shaping cell includes a simple digital-analogue converter, which converts the output signal from the digital pulse shaper into the analogue domain. This digital-analogue converter is followed by a low-pass filter with a relatively high cutoff frequency and non-selective transfer function. The output of said low-pass filter supplies the modulating signal to the gate of the control transistor of the power amplifier. It is therefore easier to integrate all these components for digitally adapting data edges, and less integrated circuit surface area is required to integrate the components.

BRIEF DESCRIPTION OF THE DRAWINGS

The objects, advantages and features of the amplitude modulation transmitter circuit for radio frequency signals according to the invention will appear more clearly in the following description with reference to at least one non-limiting embodiment illustrated by the drawing, in which.

DETAILED DESCRIPTION OF THE INVENTION

In the following description, all those electronic elements of the data amplitude modulation RF transmitter circuit, which are well known to those skilled in the art in this technical field, will only be described in a simplified manner.

Figure 2:
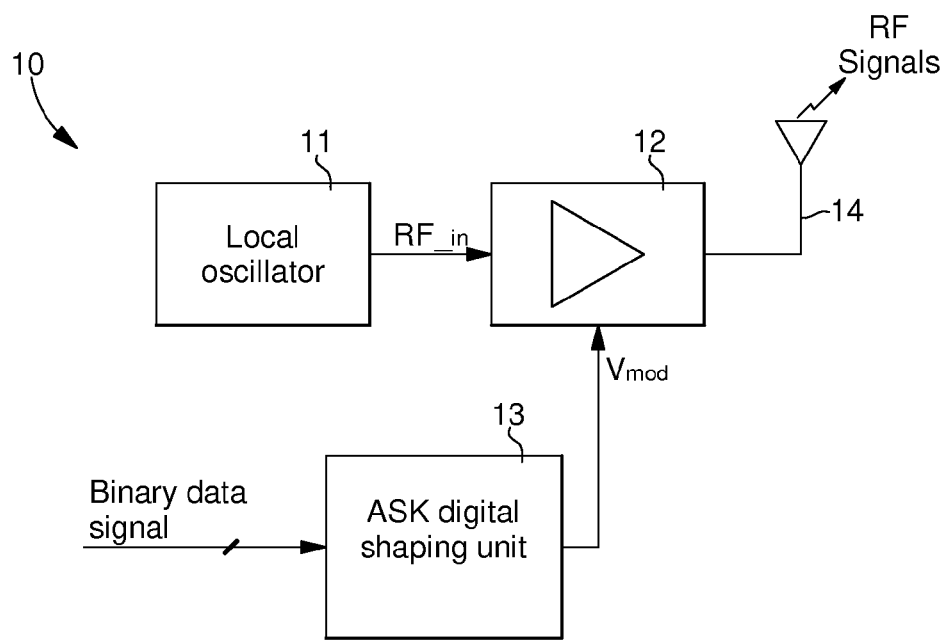
FIG. 2 shows a simplified view of the various electronic units of the data amplitude modulation transmitter circuit for radio frequency signals according to the invention.

FIG. 2 shows very generally the digital amplitude modulation radio frequency transmitter circuit 10. Circuit 10 essentially includes a local oscillator 11, which may comprise a frequency synthesiser fitted with a reference oscillator connected to a quartz resonator. This reference oscillator can supply a reference signal at a frequency which may be on the order of 13.56 MHz. This local oscillator can supply at the frequency synthesiser output an oscillating signal RF_in to the input of a power amplifier 12. This oscillating signal RF_in is generated at a determined carrier frequency for the transmission of ASK RF signals by antenna 14, which is connected to the output of power amplifier 12. The carrier frequency may be selected to be 434 MHz or 868 MHz.

Circuit 10 further includes a unit 13 for digitally shaping the data pulses to be transmitted. This shaping unit 13 receives at input a digital data signal for generating ASK RF signals to be transmitted by antenna 14 of circuit 10. The digital data signal, which defines the modulating signal or binary data flow, is on M bits described below with reference to FIG. 4. The data pulse shaping can easily be programmed in this digital part of shaping unit 13, which performs digital filtering. This means that the data transition edges can easily be digitally adapted with few electronic components, to decrease the frequency bandwidth of the ASK RF signals to be transmitted by the antenna. This avoids disturbing other nearby transmitters transmitting in close frequency bands and facilitates reception of the signals by a nearby receiver.

On the basis of the digital data signals, unit 13 thus digitally shapes the rectangular pulses of the ASK data signals, so as to supply a modulation signal Vmod after digital-analogue conversion. This modulation signal is preferably a control voltage Vmod, which is supplied to the power amplifier to modulate the amplitude of the data in the oscillating carrier frequency signal RF_in.

Figure 1:
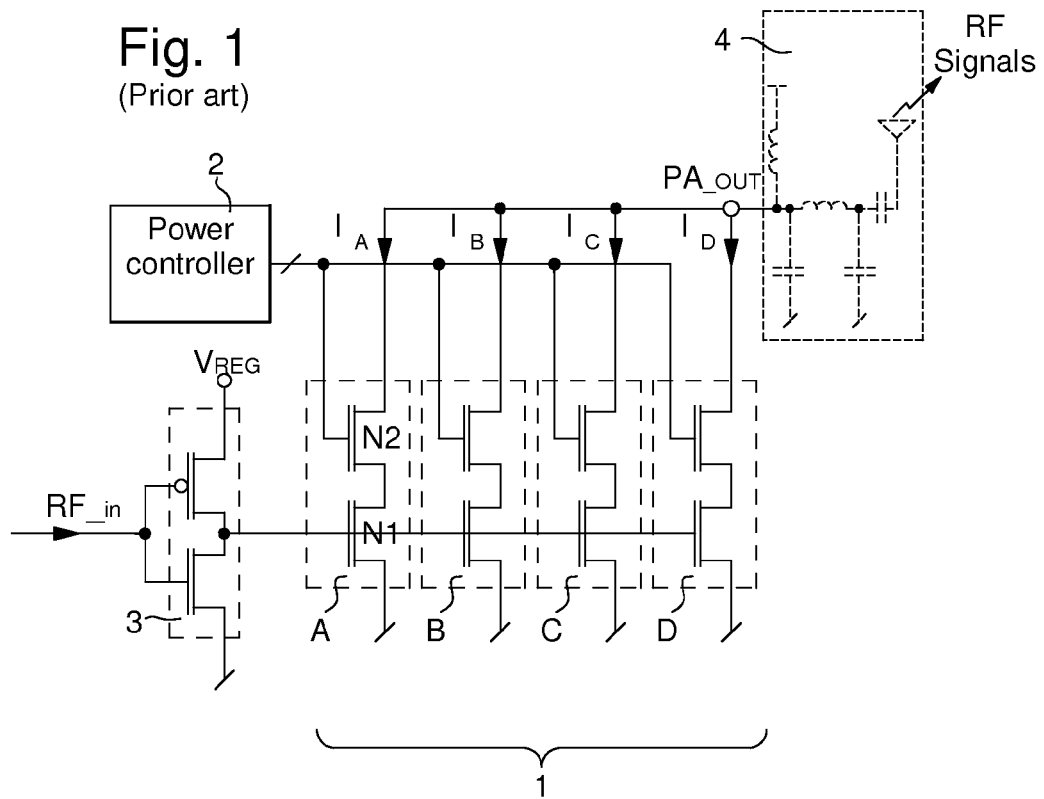
FIG. 1, cited above, shows a simplified view of an output part of a state of the art ASK RF transmitter circuit with a power amplifier.

Power amplifier 12 can advantageously be formed by a single cell with series connected MOS transistors in a cascode arrangement. As shown in FIG. 1, this cascode MOS transistor cell may be formed of two series connected NMOS transistors. The source of the first of these NMOS transistors is connected, for example, to the earth terminal of a supply voltage source of transmitter circuit 10, and the drain thereof is connected to the source of the second NMOS transistor. The drain of the second NMOS transistor is connected to an output terminal of transmitter circuit 10, which is connected to antenna 14. This antenna 14 may preferably take the form of an antenna arrangement as shown in FIG. 1 for transmitting ASK RF signals.

The first NMOS transistor can be controlled, across the gate thereof, by oscillating signal RF_in, whereas the second NMOS transistor can be controlled, across the gate thereof, by modulation voltage Vmod supplied by digital data pulse shaping unit 13. As unit 13 digitally shapes the modulating ASK signal, the data edges are digitally attenuated in the unit without the use of selective, programmable, low-pass filters with a low cutoff frequency at the input of power amplifier 12.

It is to be noted that power amplifier 12 may be made in a different manner to that described hereinbefore. The power amplifier must essentially include a first input terminal to which the oscillating signal RF_in is applied, and a second input terminal, which controls the amplitude modulation of the data to be transmitted in the ASK RF signals.

Figure 3:
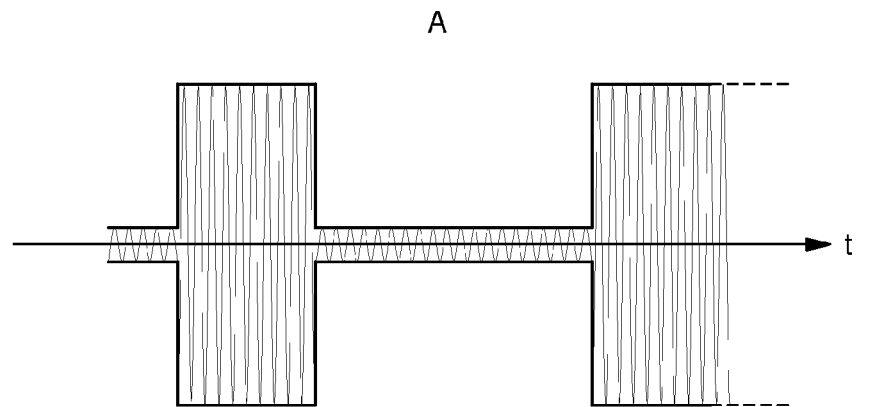
FIG. 3 shows comparative graphs of the shape of the ASK data signals in the time domain and frequency domain for a state of the art ASK RF transmitter circuit with no transition edge shaping and an ASK RF transmitter circuit according to the invention.
Figure 3:
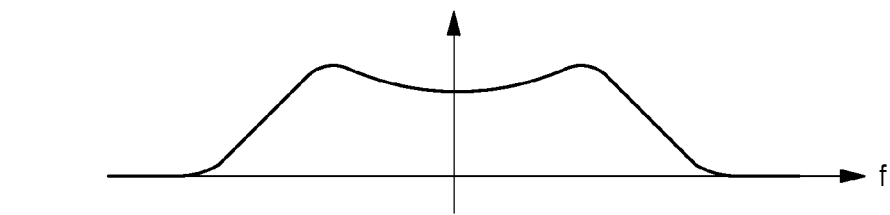
Figure 3:
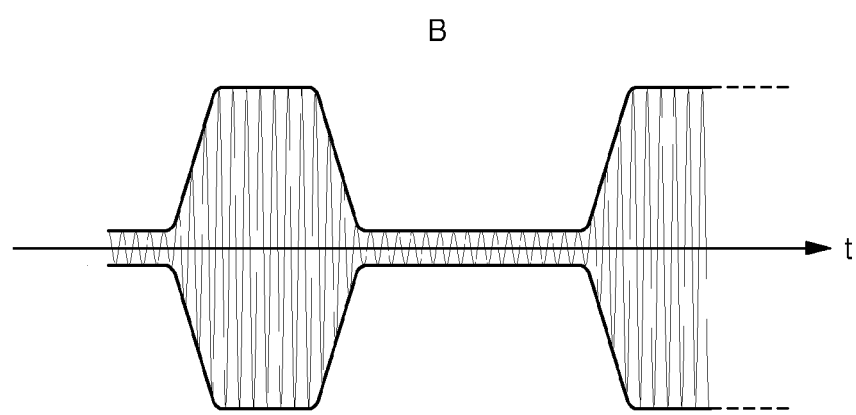
Figure 3:
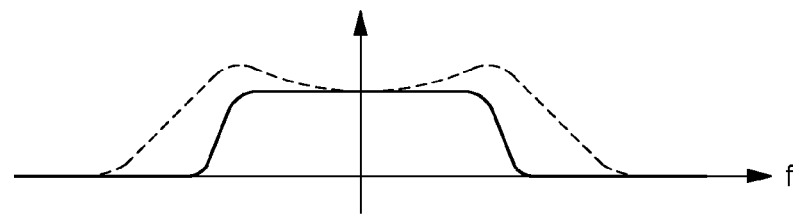

FIG. 3 shows the difference in the frequency bandwidth of the ASK data amplitude modulation radio frequency signals to be transmitted for a state of the art transmitter circuit under the reference A and a transmitter circuit of the present invention under the reference B. It will be noted under reference A that the data transition edges of the ASK RF signals are steep in the time graph, which generates a large frequency bandwidth occupied by the signal in the frequency spectrum. However, under the reference B, some attenuation or smoothing of the data transition edges is seen in the time graph, which considerably reduces the frequency bandwidth shown in the frequency spectrum, as desired. The difference in bandwidth under the reference B is clearly shown compared to that of a state of the art transmitter circuit shown in dotted lines. The rectangular data pulses are generated in baseband.

Figure 4:
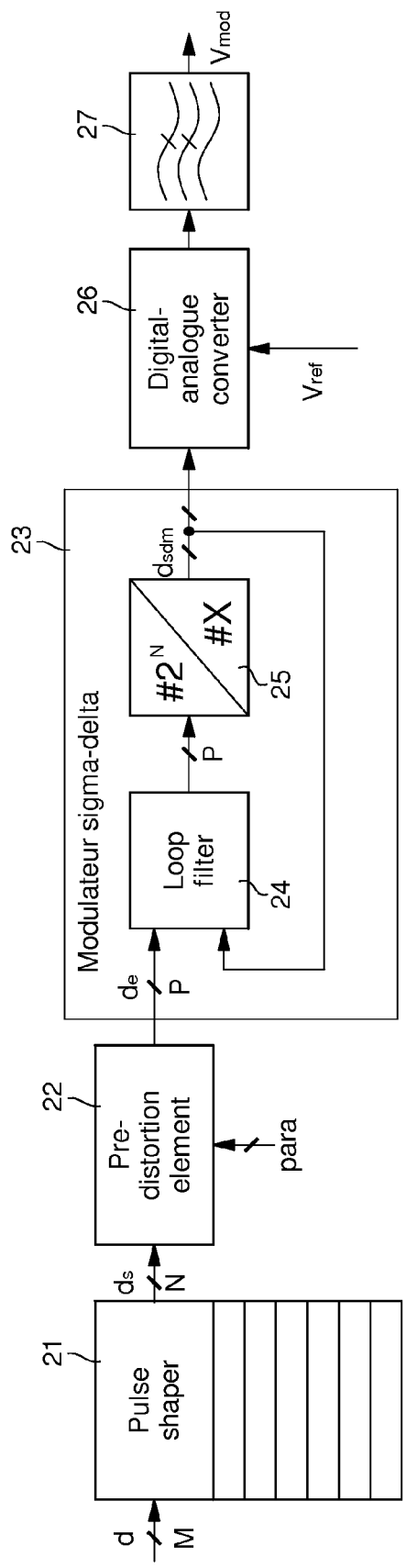
FIG. 4 shows in more detail the various electronic components of the unit for shaping the pulses and envelope of the ASK data signals of the ASK RF transmitter circuit according to the invention.

FIG. 4 shows in more detail an embodiment of the digital data pulse shaping unit for the digital amplitude modulation radio frequency transmitter circuit. This unit essentially includes a pulse shaper 21 for receiving at input a digital data signal d on M bits or digital data flow. This digital data signal is preferably a binary signal in a no return to zero (NRZ) mode with a rate on the order of 25 kBaud, i.e. 25,000 symbols per second. This digital data signal d is digitally shaped in pulse shaper 21, to attenuate the slope of the data transition edges for the ASK modulation. The attenuation of each transition edge can be defined between 5 and 20% of the duration of each data bit. The pulse shaper oversamples this binary signal by a factor of 20, i.e. with a rate on the order of 500,000 samples per second. It produces at output a filtered wave shape $d_s$, which is encoded on N bits, for example on 10 bits.

The unit further includes at output a digital-analogue conversion stage 26, 27 for converting a digital data signal shaped in the unit into an ASK modulation control signal Vmod. This control signal is preferably a modulation voltage Vmod, which is directly applied to an input terminal of the output power amplifier of the transmitter circuit. This modulation control signal Vmod modulates the amplitude of the data in the oscillating carrier frequency signal supplied by the local oscillator for the transmission of ASK RF signals by the transmitter circuit antenna.

The digital data pulse shaping unit may also comprise, after pulse shaper 21, a pre-distortion element 22, which receives from the pulse shaper a shaped and digitally filtered digital data signal $d_s$, on N bits or a shaped digital data flow. This pre-distortion element is capable of applying a non-linear transfer characteristic to the shaped digital data signal $d_s$. This means that pre-distortion can be performed on the shaped digital data signal in order to compensate for any distortion on the path of the modulation signals as far as the antenna. This pre-distortion element may be necessary given that the power amplifier is not, in principle, linear, particularly if it is a C-class amplifier. The pre-distortion element has a memory, which may contain a reference table for establishing an output value on the basis of each possible input value. It may also easily be set by a setting signal para, in order to take account also of the operating conditions of the transmitter circuit and the parameters of the integrated circuit manufacturing method.

Figure 5:
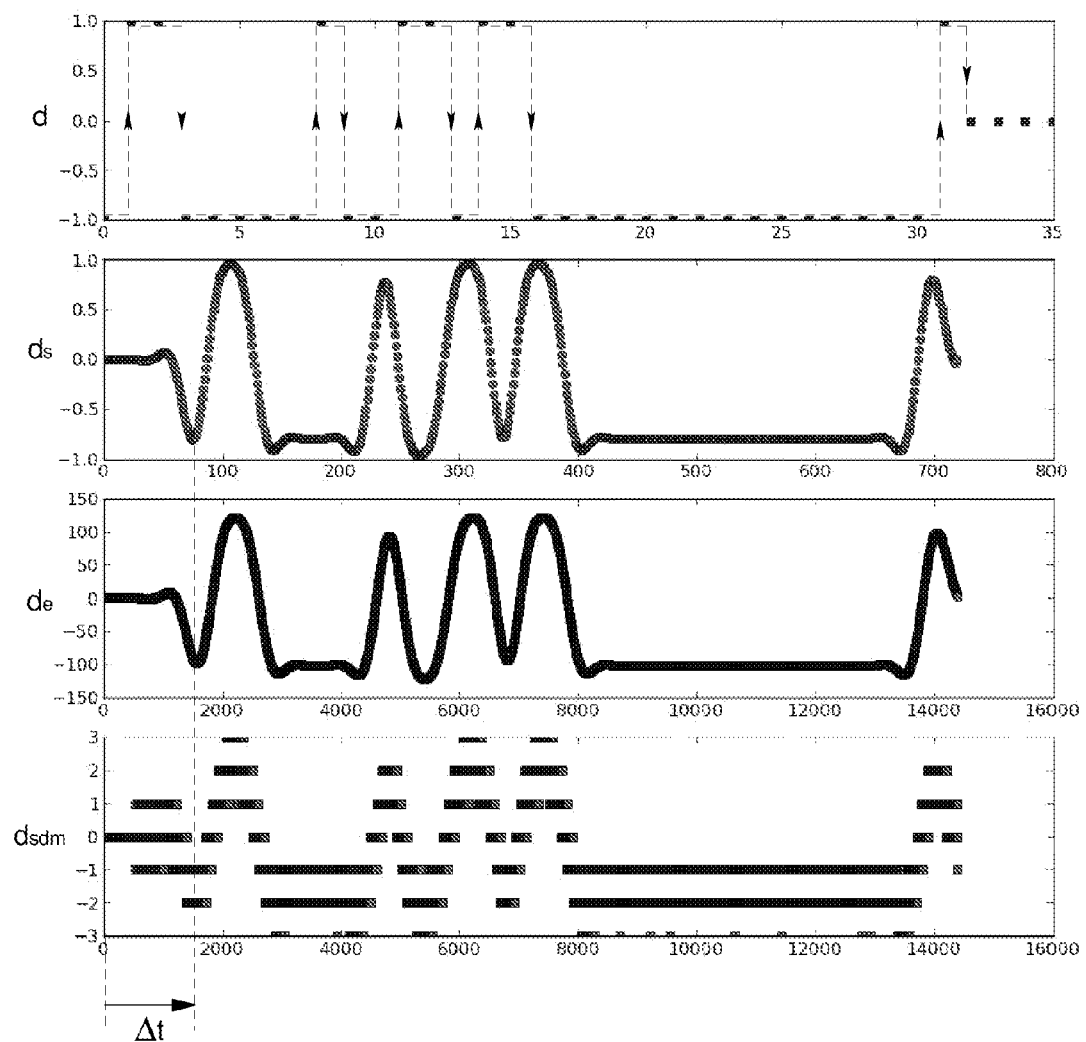
FIG. 5 shows various time graphs for the signals at the input and output of the electronic components of the digital part of the unit for shaping the pulses and envelope of the ASK data signals of the ASK RF transmitter circuit according to the invention.

The digital data pulse shaping unit further includes a sigma-delta modulator 23, after the pre-distortion element. This sigma-delta modulator 23 receives the shaped and pre-distorted digital data signal $d_e$ on P bits and supplies at output a digital data signal with several defined levels $d_{sdm}$ for a digital-analogue converter 26. The number of bits P of signal $d_e$ may be the same as that of the shaped and filtered digital signal $d_s$ at the pulse shaper output, i.e. 10 bits. This well-known sigma-delta modulator 23 is an entirely digital circuit, which comprises a digital loop filter 24 and a quantifier 25 which decreases the LSB bits. The loop filter 24 receives the shaped and pre-distorted digital data signal $d_e$ and the digital output signal $d_{sdm}$. Quantifier 25 receives a digital signal filtered by loop filter 24. This quantifier 25 is capable of quantifying the filtered digital P bit or N bit signal relating to the shaped and pre-distorted digital signal $d_e$ on X levels defined in the quantified output digital signal $d_{sdm}$. A digital quantified output signal $d_{sdm}$ may be supplied on 2 levels, 4 levels, 5 levels or 7 levels as shown in FIG. 5 explained below.

It should be noted that the sigma-delta modulation is only useful in this case if the number of levels at output is substantially smaller than the number of input levels. This is the case if the number of bits at input is for example 10, which gives rise to $2^{10}$ possible input levels, and the number of output levels may be 7.

As a result of loop filter 24 in the sigma-delta modulator, the quantification noise for this operation is removed from the modulating signal bandwidth. However, higher frequency interfering signals remain outside the bandwidth. These high frequency interfering signals are due to quantification and are distributed in a frequency band close to the sampling frequency of the sigma-delta modulator. These interfering signals are removed by low-pass filter 27 at the output of the data pulse digital shaping unit.

On the basis of the digital data signal with several defined levels $d_{sdm}$ supplied by modulator 23 and a reference voltage Vref, the digital-analogue converter 26 can convert the digital signal into a modulation control signal in the analogue domain. This modulation control signal also passes through the non-selective low-pass filter 27 to supply a filtered modulation control signal Vmod to the power amplifier for the data amplitude modulation. The cutoff frequency of this low-pass filter may be selected to be on the order of 100 kHz.

Pulse shaper 21 includes a memory in which suitable shapes for the data modulation pulses can be stored in several registers. The digital data signal received at the pulse shaper input is encoded on M bits and sampled at a first sampling frequency m times higher than the data frequency, where m is an integer number greater than or equal to 2 and preferably equal to 20. Therefore $2^M$ modulation levels are available.

In the simplest case of ON-OFF keying modulation, M=1 and the number of levels is 2. The first data sampling signal for the pulse shaper may be supplied by the local oscillator on the basis of the reference signal from the quartz oscillator and one or several frequency dividers. If the quartz oscillator reference signal is selected to be at 13.56 MHz, the first sampling frequency fs/n for the pulse shaper and the pre-distortion element 22 may be on the order of 678 kHz. To achieve this, the reference signal passes through a set of dividers to divide the reference frequency by a factor n equal to 20. However, the sampling carried out in sigma-delta modulator 23 is performed by a second sampling signal at a frequency n times higher than the first sampling frequency, where n is an integer number greater than or equal to 2. This second sampling signal can be obtained immediately on the basis of the local oscillator reference signal at a sampling frequency fs equal to 13.56 MHz.

According to a first embodiment of the pulse shaper, the best spectral efficiency can be obtained by using an FIR type finite impulse response frequency filter. An example embodiment of this type of FIR filter is described in EP Patent Application No. 0 383 326 A2 in FIG. 1 and from line 41 of column 3 of the description. This FIR filter multiplies the signal spectrum for example with a raised cosine transfer function. This type of FIR filter implements the convolution of the digital data signal received at input, with a finite impulse response. The impulse response samples are stored in the memory. The transfer function of the FIR filter can be modified by selecting suitable stored sample values. This implementation is capable of covering symbol transitions, which extend over more than one period per symbol and cope well with multiple modulation levels. The signal shaped by this raised cosine filter is in a bandwidth on the order of 16 kHz.

A typical pulse shaper 21, implemented as an FIR filter, can therefore consist of a memory, which stores the impulse response samples, registers, which act as signal delay gates, and combined digital circuits, such as adders and multipliers implementing the convolution. In the registers of pulse shaper 21, it is therefore possible to store different wave shapes for the data amplitude modulation. A stored wave shape can be specifically selected. The data transition edges are thus attenuated or smoothed at the pulse shaper output to define a data transition curve so as to reduce the bandwidth of the ASK RF signals to be transmitted by the transmitter circuit antenna.

According to a second, less expensive embodiment of pulse shaper 21, to shape the signal pulses, it is possible to store in the memory a sequence of values representing the attenuated transition wave shape for each possible transition between two modulation levels. To achieve this, a memory is provided, which stores the transition wave shape samples, and a digital control circuit, which detects the transition at the input and selects the suitable wave shape at the output. If a transition is detected at the input of pulse shaper 21, the corresponding wave shape samples are taken out in succession at the increased sampling rate. In this simple form, the second embodiment of the pulse shaper is not capable of processing the transitions, which extend beyond one symbol period. Moreover, since the number of possible transitions increases quadratically with the number of modulation levels, this method may require a larger memory space than the first embodiment of the pulse shaper.

FIG. 5 shows different time graphs of the signals at the input and output of the electronic components of the digital part of the unit for digitally shaping the data pulses to modulate the amplitude of the RF signals to be transmitted. The digital data signal d or binary data flow which is supplied to the pulse shaper, is shown in the first graph from the top. The various symbols of the digital data signal d are defined on the basis of a bipolar (bivalent) code with a level −1 to define a state "0" and with a level +1 to define a state "1". In this example, this digital data signal d may have a data rate on the order of 25 kBaud, i.e. 25,000 symbols per second. Each symbol is represented on the graph by a rectangle, the first symbol of which is defined here by a state "0" at −1. The series of symbols in this first graph represents the data "011000001001101100000000000000001" and so on, clearly showing the transition of data from a state "0" to a state "1" and vice versa by the dotted lines.

It should be noted that each symbol can thus also be defined in more than two states. Each symbol may also be trivalent or tetravalent so as to bring more information to be transmitted. In these conditions, a bus with several digital lines is required to bring the digital data signal to the pulse shaper input.

The second graph from the top represents the digital data signal $d_s$ shaped by the pulse shaper passing through a raised cosine filter implemented as an FIR type filter. This shaped digital data signal is sampled by the sampling signal, the frequency of which is, for example, 20 times higher than the data frequency, i.e. 500,000 samples per second. Since the FIR filter includes a certain number of delay gates, there is inevitably a time lag Δt for each symbol represented in the shaped digital data signal $d_s$ relative to each symbol of digital input signal d. This time lag Δt may have a value of several data rate periods, namely on the order of 0.1 millisecond. It is normally less than 1 millisecond, and preferably close to 0.1 millisecond.

The first symbol of the digital input signal, which defines a state "0" therefore only appears in the shaped digital data signal after a time lag Δt of at least 0.1 millisecond. All the 10-bit samples at the pulse shaper output represent a wave shape with attenuated or smoothed data transition edges in the form of transition curves. This digital wave shape at the pulse shaper output, which is shown in the second graph, approximately matches the analogue wave shape of the control signal Vmod at the unit output.

The third graph from the top shows the shaped digital data signal $d_e$ after passing through the pre-distortion element. This digital signal, which is supplied at the sigma-delta modulator input, has undergone an oversampling operation with a sampling signal at a frequency n times higher and preferably 20 times higher than that of the sampling signal for the pulse shaper. In this case, more than 10,000,000 samples per second are supplied in this digital data signal at the pre-distortion element output. Preferably, more than 13,000,000 samples per second are provided according to the local oscillator reference frequency. However, for the sake of simplicity, no pre-distortion has been carried out in the pre-distortion element in the third graph. This digital wave shape also matches the analogue wave shape of control signal Vmod at the output of the unit to control the data amplitude modulation in the power amplifier.

It is also to be noted that an interpolation filter may be inserted between the pulse shaper and the sigma-delta modulator. This means that spectral folding is removed from the pulse shaper output.

The fourth graph shows the digital output signal $d_{sdm}$ from the sigma-delta modulator, which is sampled at the same frequency as the pre-distortion element. It is to be noted that at the quantifier output, the output signal is spread over a defined number X of levels. In the case shown, this digital output signal is shown on 7 levels. The samples thereby produced at the sigma-delta modulator output are shown on these 7 levels between −3 and +3. There are very quick jumps from one sample to another between these levels although it is not possible to see them properly on this fourth graph given that more than 13,000,000 samples are obtained per second. This digital signal on 7 levels can then be supplied to the digital-analogue converter. This digital-analogue converter is simple to make compared to a high resolution converter, which would be necessary if one wished to convert the outgoing pre-distortion element signal immediately without sigma-delta modulation.

It is clear that the sigma-delta modulator can supply a digital output signal on a lower number of levels, for example on only two levels as explained below with reference to FIG. 6 which shows the digital-analogue converter and the low-pass output filter. This may also depend upon the application envisaged for the ASK RF transmitter circuit.

Figure 6:
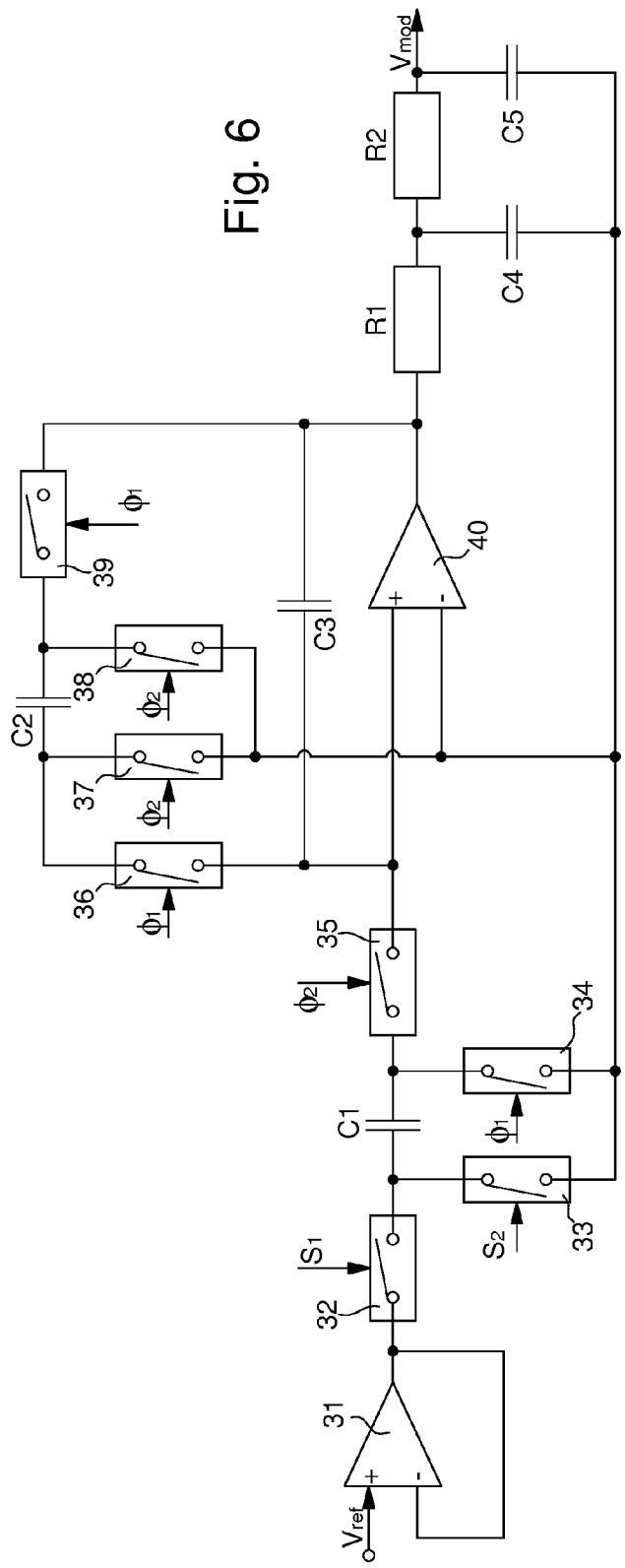
FIG. 6 shows a detailed embodiment of the digital-analogue conversion and low-pass filtering at output for supplying a data modulation control voltage from the unit to shape the pulses and envelope of the ASK data signals of the ASK RF transmitter circuit according to the invention.
Figure 7:
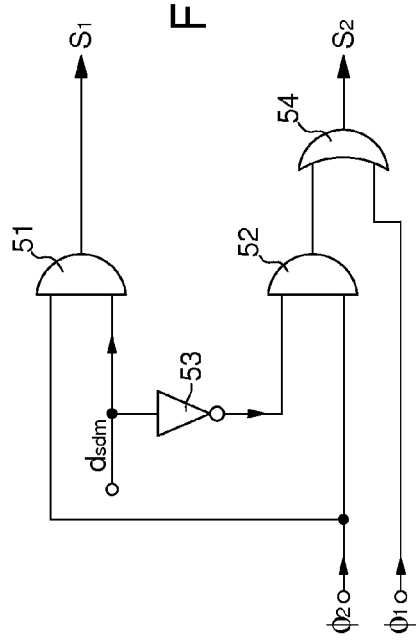
FIG. 7 shows an electronic arrangement for generating switching signals for the digital-analogue conversion and low-pass filtering of the unit to shape the data pulses according to the invention.

One embodiment of the digital-analogue converter with the low-pass output filter is thus shown in FIG. 6, together with the electronic arrangement for generating the various converter switching signals in FIG. 7. The digital-analogue converter is of conventional design and can be formed of an array of capacitors switched according to the number of levels of the digital output signal $d_{sdm}$ supplied by the sigma-delta modulator. For the sake of simplicity, this digital output signal $d_{sdm}$ is only defined on two levels for the explanation of the FIG. 6 embodiment of the digital-analogue converter.

The digital-analogue converter includes a first operational amplifier 31 arranged in the form of a voltage follower. A reference voltage Vref is supplied to the input of this voltage follower 31. The reference voltage at the voltage follower output is supplied via a first switch 32 to a first terminal of a first capacitor C1. This first switch 32 is controlled by a first switching signal $S_1$ to alternate between a closed position and an open position at a frequency matching the frequency of the local oscillator reference frequency. This first switching signal $S_1$ is defined by the electronic arrangement shown in FIG. 7 and explained below.

A second switch 33 is connected between the first terminal of the first capacitor C1 and a low potential terminal below reference voltage Vref. This low potential may also be the earth potential of the ASK RF transmitter circuit. The value of this low potential will be chosen in particular according to the embodiment of the operational amplifier and the desired output dynamic of the control signal Vmod. This second switch 33 is controlled by a second switching signal $S_2$ obtained in accordance with the electronic arrangement of FIG. 7.

The second terminal of first capacitor C1 is connected to a third switch 34, the output of which is connected to a low potential terminal. This third switch 34 is controlled by a third switching signal $\phi_1$ which is a clock signal with rectangular pulses and at a frequency matching the local oscillator reference frequency. The third switch 34 can be closed when the third signal $\phi_1$ is in state "1" and opened when the third signal $\phi_1$ is in state "0". The second terminal of the first capacitor C1 is also connected to a fourth switch 35, the output of which is connected, on the one hand, to a positive input terminal of a second operational amplifier 40, and on the other hand to a first terminal of a third capacitor C3 and a fifth switch 36. The second terminal of third capacitor C3 is connected to the output of the second operational amplifier 40. The negative input terminal of the second operational amplifier 40 is connected to the low potential terminal.

The fourth switch 35 is controlled by a fourth switching signal $\phi_2$ which is in the high state when the third switching signal $\phi_1$ is in a low state, although there is no overlapping of $\phi_1$ and $\phi_2$ in the high state. The fifth switch 36 is, however, controlled by the third switching signal $\phi_1$ and is also connected at output to a first terminal of a second capacitor C2. A sixth switch 37 is mounted between the first terminal of the second capacitor C2 and the low potential terminal, and it is controlled by the fourth switching signal $\phi_2$.

A seventh switch 38 is mounted between the second terminal of the second capacitor C2 and the low potential terminal. This seventh switch 38 is also controlled by the fourth switching signal $\phi_2$. An eighth switch 39 is also connected between the second terminal of the second capacitor C2 and the output terminal of the second operational amplifier 40. This eighth switch 39 is controlled by the third switching signal $\phi_1$.

It is to be noted that each switch can be achieved by means of an MOS transistor, the gate of which receives the corresponding switching signal. If it is an NMOS transistor, the switch is closed when the gate voltage is close to the high value of the supply voltage, which may be 3.5 V and the reverse is true for a PMOS transistor. Moreover, to perform a conversion with a digital output signal from the sigma-delta modulator with a higher number of levels than 2, there will be several parallel C1 type capacitors to form a well known switched capacitor array. In fact, 4 switched capacitors would be needed for a digital signal on 5 levels.

From the output of the second operational amplifier 40, a low-pass filter is arranged and configured at a cutoff frequency on the order of 100 kHz. The low-pass filter does not need to be selective and may, therefore, be made with a limited number of capacitors and resistors. This low-pass filter is formed of a first filter comprising a first resistor R1 connected to a fourth capacitor C4 and a second filter comprising a second resistor R2 connected to a fifth capacitor C5. A modulation voltage Vmod with data transition edge adaptation is thus supplied at the low-pass filter output to the connection node between the second resistor R2 and the fifth capacitor C5.

The electronic arrangement for generating the various switching signals is shown in FIG. 7. The digital output signal from the sigma-delta modulator $d_{sdm}$ is applied on the one hand to an input of a first AND logic gate 51 and on the other hand to an input of a second AND logic gate 52 passing through an inverter 53. The fourth switching signal $\phi_2$ is also directly applied to another input of the first AND logic gate 51 and to another input of the second AND logic gate 52. The output of the first AND logic gate supplies the first switching signal S1. The output of the second AND logic gate 52 is connected to an input of an OR logic gate 54 which receives the third switching signal c1 at another input. The output of the OR logic gate 54 supplies the second switching signal $S_2$.

From the description that has just been given, several variants of the data amplitude modulation radio frequency transmitter circuit can be devised by those skilled in the art without departing from the scope of the invention defined by the claims. Instead of a sigma-delta modulator in the digital data pulse shaper unit, a pulse width modulation modulator may be used. This type of PWM modulator is simpler than a sigma-delta modulator, but is liable to generate more quantification noise.

What is claimed is:

1. A data amplitude modulation circuit for the transmission of radio frequency signals, the circuit including:
   a local oscillator for generating an oscillating signal at a determined carrier frequency,
   a unit for shaping data pulses to supply a data amplitude modulation control signal, and
   a power amplifier receiving the oscillating signal from the local oscillator and the data amplitude modulation control signal from the data pulse shaping unit, for the transmission of data amplitude modulated radio frequency signals by an antenna or an antenna arrangement,
   wherein the data pulse shaping unit includes a pulse shaper for digitally adapting the data transition edges on the basis of an incoming digital data signal, and a digital-analogue conversion stage for converting a digital data signal shaped in the unit, so as to supply the data amplitude modulation control signal to the power amplifier,
   wherein the pulse shaper includes several wave shapes stored in a memory, wherein each wave shape can be individually selected to digitally attenuate or smooth all the transition edges of the data to be transmitted in the data amplitude modulated radio frequency signals.

2. The circuit according to claim 1, wherein the pulse shaper includes several wave shapes each stored in a specific register in the memory, so as to be selectively chosen, and wherein, on the basis of the incoming digital data signal, the pulse shaper supplies a digital data signal digitally shaped on N bits, where N is an integer number greater than 1.

3. The circuit according to claim 2, wherein the pulse shaper is configured to supply a digital data signal digitally shaped on N bits, such as 10 bits, and sampled by a first sampling signal at a frequency m times higher than the data frequency of the incoming digital data signal, where m is an integer number higher than or equal to 2.

4. The circuit according to claim 1, wherein the pulse shaper includes a raised cosine filter implemented in the form of a finite impulse response filter for shaping the data pulses of the incoming digital data signal.

5. The circuit according to claim 1, wherein the digital-analogue conversion stage includes a digital-analogue converter and a non-selective low-pass filter for supplying the data amplitude modulation control signal (Vmod) to the power amplifier.

6. The circuit according to claim 1, wherein the data pulse shaping unit further includes a sigma-delta modulator arranged between the pulse shaper and the digital-analogue conversion stage, said sigma-delta modulator including a loop filter for receiving the digital data signal shaped by the pulse shaper and a quantifier for receiving the filtered digital data signal, in order to supply a quantified digital output signal on X defined levels to the digital-analogue conversion stage, where X is an integer number greater than or equal to 2.

7. The circuit according to claim 6, wherein the data pulse shaping unit further includes a pre-distortion element arranged between the pulse shaper and the sigma-delta modulator, wherein the pre-distortion element includes a memory with a reference table which can be set to apply a non-linear transfer characteristic to the digital data signal ($d_s$) shaped by the pulse shaper to compensate for any distortion on the path of the modulation signals, and to supply a shaped and pre-distorted digital data signal ($d_e$) on P bits to the sigma-delta modulator.

8. The circuit according to claim 7, wherein the sigma-delta modulator operates on the basis of a second sampling signal at a frequency n times higher than the sampling frequency of a first sampling signal applied to the pulse shaper and to the pre-distortion element, where n is an integer number greater than or equal to 2.

9. The circuit according to claim 8, wherein the local oscillator includes a frequency synthesiser provided with a reference oscillator connected to a quartz resonator, said reference oscillator supplying a reference signal used for the supply of the second sampling signal at a frequency matching the frequency of the reference signal, and wherein the first sampling signal from the pulse shaper is obtained by the reference signal via a series of frequency dividers so as to obtain a first sampling frequency n times lower than the frequency of the second sampling signal, and preferably 20 times lower.

10. The circuit according to claim 5, wherein the non-selective low-pass filter is adapted to a cutoff frequency lower than the frequency of the quantification noise generated by a sigma-delta modulator.

11. The circuit according to claim 1, wherein the power amplifier includes two series connected MOS transistors in a cascode arrangement between a terminal of the antenna and a terminal of a supply voltage source, particularly an earth terminal, wherein a first of the two MOS transistors is controlled across the gate thereof by the oscillating signal from the local oscillator, and wherein a second of the two MOS transistors is controlled across the gate thereof by the data amplitude modulation control signal supplied by the unit, said control signal (Vmod) being a control voltage having attenuated data transition edges.

12. A data amplitude modulation circuit for the transmission of radio frequency signals, the circuit including:
   a local oscillator for generating an oscillating signal at a determined carrier frequency,
   a unit for shaping data pulses to supply a data amplitude modulation control signal, and
   a power amplifier receiving the oscillating signal from the local oscillator and the data amplitude modulation control signal from the data pulse shaping unit, for the transmission of data amplitude modulated radio frequency signals by an antenna or an antenna arrangement,
   wherein the data pulse shaping unit includes a pulse shaper for digitally adapting the data transition edges on the basis of an incoming digital data signal, and a digital-analogue conversion stage for converting a digital data signal shaped in the unit, so as to supply the data amplitude modulation control signal to the power amplifier,
   wherein the data pulse shaping unit further includes a sigma-delta modulator arranged between the pulse shaper and the digital-analogue conversion stage, said sigma-delta modulator including a loop filter for receiving the digital data signal shaped by the pulse shaper and a quantifier for receiving the filtered digital data signal, in order to supply a quantified digital output signal on X defined levels to the digital-analogue conversion stage, where X is an integer number greater than or equal to 2.

13. The circuit according to claim 12, wherein the data pulse shaping unit further includes a pre-distortion element arranged between the pulse shaper and the sigma-delta modulator, wherein the pre-distortion element includes a memory with a reference table which can be set to apply a non-linear transfer characteristic to the digital data signal (ds) shaped by the pulse shaper to compensate for any distortion on the path of the modulation signals, and to supply a shaped and pre-distorted digital data signal (de) on P bits to the sigma-delta modulator.

14. The circuit according to claim 13, wherein the sigma-delta modulator operates on the basis of a second sampling signal at a frequency n times higher than the sampling frequency of a first sampling signal applied to the pulse shaper and to the pre-distortion element, where n is an integer number greater than or equal to 2.

15. The circuit according to claim 14, wherein the local oscillator includes a frequency synthesiser provided with a reference oscillator connected to a quartz resonator, said reference oscillator supplying a reference signal used for the supply of the second sampling signal at a frequency matching the frequency of the reference signal, and wherein the first sampling signal from the pulse shaper is obtained by the reference signal via a series of frequency dividers so as to obtain a first sampling frequency n times lower than the frequency of the second sampling signal, and preferably 20 times lower.

* * * * *